United States Patent [19]

McCullough

[11] Patent Number: 6,048,919
[45] Date of Patent: Apr. 11, 2000

[54] THERMALLY CONDUCTIVE COMPOSITE MATERIAL

[75] Inventor: Kevin A. McCullough, Warwick, R.I.

[73] Assignee: Chip Coolers, Inc., Warwick, R.I.

[21] Appl. No.: 09/239,913

[22] Filed: Jan. 29, 1999

[51] Int. Cl.[7] .............................. C08K 3/38; C08K 3/22; C08K 3/10; C08K 3/04
[52] U.S. Cl. ..................... 524/404; 524/430; 524/437; 524/439; 524/440; 524/495; 524/496; 252/511
[58] Field of Search .................... 524/404, 430, 524/437, 439, 440, 495, 496; 252/511

[56] References Cited

U.S. PATENT DOCUMENTS

| | | | |
|---|---|---|---|
| T904,012 | 11/1972 | Staniland | 252/503 |
| 3,398,233 | 8/1968 | Lizasoain et al. | |
| 3,673,121 | 6/1972 | Meyer | 252/511 |
| 3,708,387 | 1/1973 | Turner et al. | |
| 4,098,945 | 7/1978 | Oehmke | 428/327 |
| 4,307,147 | 12/1981 | Ohishi et al. | 428/268 |
| 4,367,745 | 1/1983 | Welage | 128/303.13 |
| 4,496,475 | 1/1985 | Abrams | 252/514 |
| 4,568,592 | 2/1986 | Kawaguchi et al. | 428/107 |
| 4,664,971 | 5/1987 | Soens | 428/288 |
| 4,689,250 | 8/1987 | Quella et al. | 427/216 |
| 4,816,184 | 3/1989 | Fukuda et al. | 252/511 |
| 5,011,870 | 4/1991 | Peterson | 523/220 |
| 5,011,872 | 4/1991 | Latham et al. | 523/440 |
| 5,021,494 | 6/1991 | Toya | 524/404 |
| 5,098,610 | 3/1992 | Okamura et al. | 524/495 |
| 5,098,611 | 3/1992 | Honda et al. | 252/518 |
| 5,106,540 | 4/1992 | Barma et al. | 252/511 |
| 5,180,513 | 1/1993 | Durand | 252/62.55 |
| 5,183,594 | 2/1993 | Yoshinaka et al. | 252/518 |
| 5,213,715 | 5/1993 | Patterson et al. | 252/518 |
| 5,225,110 | 7/1993 | Kathirgamanathan | 252/512 |
| 5,286,416 | 2/1994 | Teichmann et al. | 252/512 |
| 5,302,456 | 4/1994 | Matsui | 428/407 |
| 5,334,330 | 8/1994 | Rowlette | 252/512 |
| 5,373,046 | 12/1994 | Okamura et al. | 524/496 |
| 5,397,608 | 3/1995 | Soens | 428/34.5 |
| 5,445,308 | 8/1995 | Nelson et al. | 228/121 |
| 5,490,319 | 2/1996 | Nakamura et al. | 29/596 |
| 5,522,962 | 6/1996 | Koskenmaki et al. | 156/272.4 |
| 5,536,568 | 7/1996 | Teruo | 428/327 |
| 5,580,493 | 12/1996 | Chu et al. | 252/511 |
| 5,669,381 | 9/1997 | Hyatt | 428/402 |
| 5,681,883 | 10/1997 | Hill et al. | 524/404 |
| 5,770,305 | 6/1998 | Terasaka | 428/328 |
| 5,834,337 | 11/1998 | Unger et al. | 438/122 |
| 5,851,644 | 12/1998 | McArdle et al. | 428/213 |
| 5,863,467 | 1/1999 | Mariner et al. | 252/511 |
| 5,945,217 | 8/1999 | Hanrahan | 428/403 |

*Primary Examiner*—Tae Yoon
*Attorney, Agent, or Firm*—Barlow, Josephs & Holmes, Ltd.

[57] ABSTRACT

A conductive molding composition, with a thermal conductivity above 22 W/m° K., is provided. The thermally conductive composition includes a polymer base matrix of, by volume, between 30 and 60 percent. A first thermally conductive filler, by volume, between 25 and 60 percent is provided in the composition that has a relatively high aspect ratio of at least 10:1. Also in the composition mixture is a second thermally conductive filler, by volume, between 10 and 25 percent that has a relatively low aspect ratio of 5:1 or less.

22 Claims, 3 Drawing Sheets

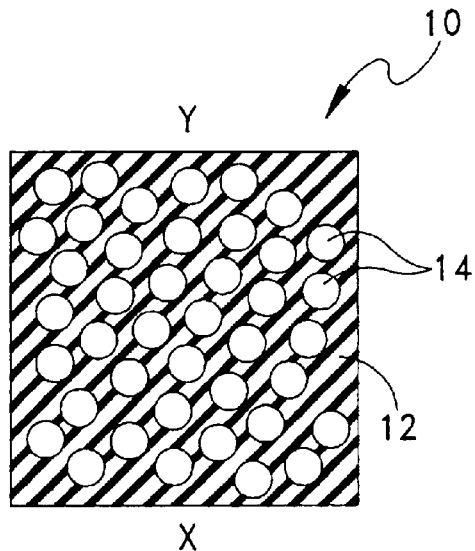
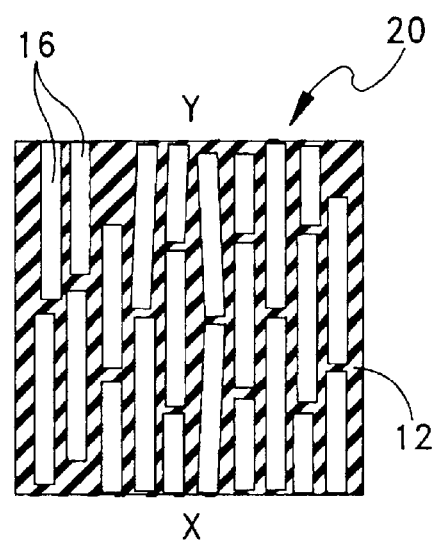
FIG. 1
(PRIOR ART)
FIG. 2
(PRIOR ART)
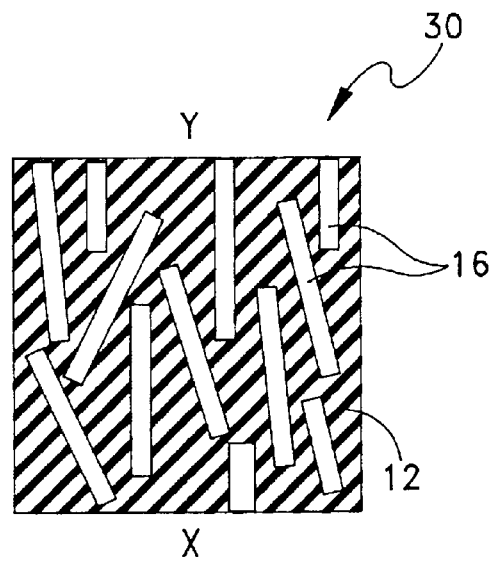
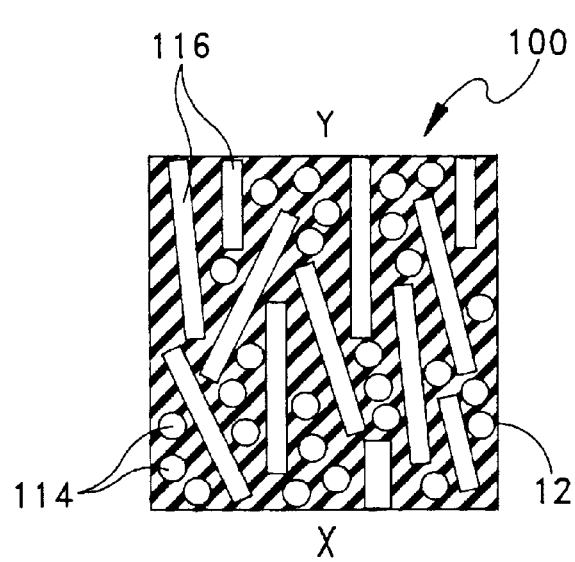
FIG. 3
(PRIOR ART)
FIG. 4

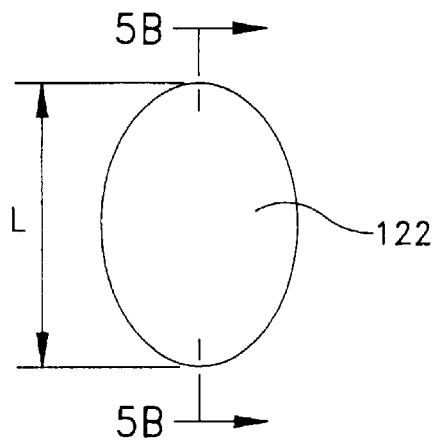
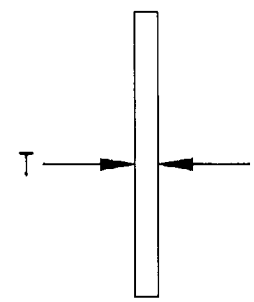
FIG. 5A  FIG. 5B
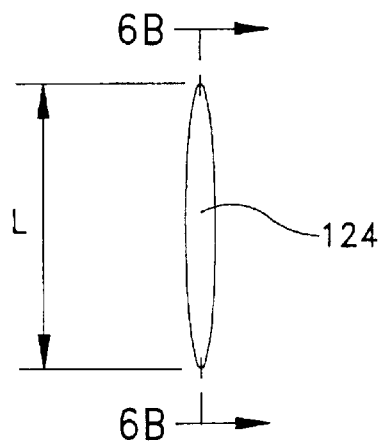
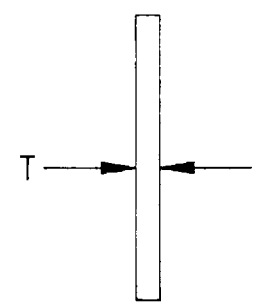
FIG. 6A  FIG. 6B
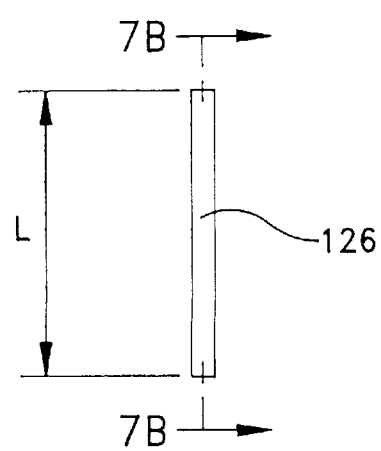
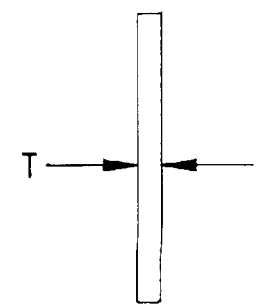
FIG. 7A  FIG. 7B

THERMALLY CONDUCTIVE COMPOSITE MATERIAL

BACKGROUND OF THE INVENTION

The present invention relates generally to an improved composite material. More specifically, the present invention relates to a thermally conductive composite material that is easily moldable or castable.

In the heat sink industries industries, it has been well known to employ metallic materials for thermal conductivity applications, such as heat dissipation for cooling semiconductor device packages. For these applications, such as heat sinks, the metallic material typically is tooled or machined from bulk metals into the desired configuration. However, such metallic conductive articles are typically very heavy, costly to machine and are susceptible to corrosion. Further, the geometries of machined metallic heat dissipating articles are very limited to the inherent limitations associated with the machining or tooling process. As a result, the requirement of use of metallic materials which are machined into the desired form, place severe limitations on heat sink design particular when it is known that certain geometries, simply by virtue of their design, would realize better efficiency but are not attainable due to the limitations in machining metallic articles.

It is widely known in the prior art that improving the overall geometry of a heat dissipating article, can greatly enhance the overall performance of the article even if the material is the same. Therefore, the need for improved heat sink geometries necessitated an alternative to the machining of bulk metallic materials. To meet this need, attempts have been made in the prior art to provide molded compositions that include conductive filler material therein to provide the necessary thermal conductivity. The ability to mold a conductive composite enabled the design of more complex part geometries to realize improved performance of the part.

The attempts in the prior art included the employment of a polymer base matrix loaded with a granular material, such as boron nitride grains. Also, attempts have been made to provide a polymer base matrix loaded with flake-like filler material. These attempts are, indeed, moldable into complex geometries but still do not approach the desired performance levels found in metallic machined parts. In addition, known conductive plastic materials are undesirable because they are typically very expensive to manufacture because they employ very expensive filler materials. Still further, these conductive composite materials must be molded with extreme precision due to concerns of filler alignment during the molding process. Even with precision molding and design, inherent problems of fluid turbulence, collisions with the mold due to complex product geometries make it impossible to position the filler ideally thus causing the composition to perform far less than desirable.

Moreover, the entire matrix of the composition must be satisfactory because heat transfer is a bulk property rather than a direct path property such as the transfer of electricity. A direct path is needed to conduct electricity. However, heat is transferred in bulk where the entire volume of the body is employed for the transfer. Therefore, even if a highly conductive narrow conduit is provided through a much lower conductive body, the heat transfer would not be as good as a body which is consistently marginally conductive throughout the entire body. Therefore, consistency of the thermal conductivity of the entire matrix of the composite body is essential for overall high thermal conductivity.

In view of the foregoing, there is a demand for a composite material that is highly thermally conductive. In addition, there is a demand for a composite material that can be molded or cast into complex product geometries. There is also a demand for such a moldable article that exhibits thermal conductivity as close as possible to purely metallic conductive materials while being relatively low in cost to manufacture.

SUMMARY OF THE INVENTION

The present invention preserves the advantages of prior art thermally conductive plastic compositions. In addition, it provides new advantages not found in currently available compositions and overcomes many disadvantages of such currently available compositions.

The invention is generally directed to the novel and unique thermally conductive plastic composite material with particular application in heat sink applications where heat must be moved from one region to another to avoid device failure. The composite material of the present invention enables a highly thermally conductive composite material to be manufactured at relatively low cost. The conductive molding composition of the present invention has a thermal conductivity above 22 W/m° K. The thermally conductive composition includes a polymer base matrix of, by volume, between 30 and 60 percent. A first thermally conductive filler, by volume, between 25 and 60 percent is provided in the composition that has a relatively high aspect ratio of at least 10:1. Also in the composition mixture is a second thermally conductive filler, by volume, between 10 and 25 percent that has a relatively low aspect ratio of 5:1 or less.

During the molding process of the composition of the present invention, the mixture is introduced into a mold cavity and flows into the various part geometries. The high aspect ratio filler generally aligns with the flow of the mixture in the mold but inherently leaves small random voids therebetween. The low aspect ratio filler in the mixture fills the voids between the high aspect ratio filler in the mixture. As a result, the number of interfaces and base matrix thickness between filler members is greatly reduced thus resulting in thermal conductivity and performance superior to that found in prior art thermally composite materials.

It is therefore an object of the present invention to provide a conductive composite material that has a thermal conductivity much greater than found in prior art composites.

It is an object of the present invention to provide a conductive composite material that is moldable.

It is a further object of the present invention to provide a low cost conductive composite material.

Another object of the present invention is to provide a conductive composite material that enables the molding of complex part geometries.

It is a further object of the present invention to provide a conductive composite material that is significantly lighter in weight than metallic materials.

It is yet a further object of the present invention to provide a conductive composite material that has a thermal conductivity close to pure metallic materials.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

FIG. 1 is a cross-section of a prior art thermally conductive composite material employing a low aspect ratio filler in a base matrix;

FIG. 2 is a cross-section of a prior art thermally conductive composite material employing a high aspect ratio in a base matrix with filler shown in theoretical ideal alignment;

FIG. 3 is a cross-section of a prior art thermally conductive composite material employing a high aspect ratio filler in a base matrix with filler shown in a realistic alignment after molding;

FIG. 4 is a cross-section of the thermally conductive composite material in accordance with the present invention employing both high aspect ratio filler and low aspect ratio filler;

FIG. 5A is a top view of a high aspect ratio filler member of a flake-like configuration;

FIG. 5B is a cross-sectional view through the line 5B—5B of FIG. 5A;

FIG. 6A is a top view of a high aspect ratio filler member of a rice-like configuration FIG. 6B is a cross-sectional view through the line 6B—6B of FIG. 6A;

FIG. 7A is a top view of a high aspect ratio filler member of a strand-like configuration;

FIG. 7B is a cross-sectional view through the line 7B—7B of FIG. 7A;

DETAILED DESCRIPTION OF THE PREFERRED EMBODIMENT

Figure 8:
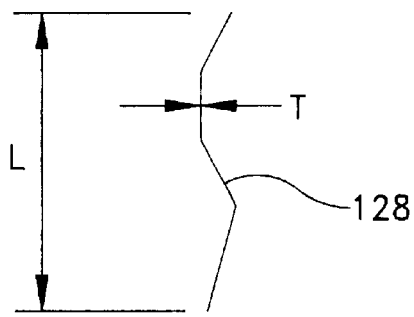
FIG. 8 is a top view of a high aspect ratio filler member of a whisker-like configuration.

Referring first to FIGS. 1–3, various prior art composite materials 10 and 30, which are readily commercially available, are shown. In particular, these prior art composite materials 10 and 30 generally show a base matrix of polymer 12, for example, with different types of filler material 14 and 16. Each of these compositions are shown in enlarged detail for clarity and ease of illustration.

As seen in FIG. 1, a cross-sectional view of a prior art composite material 10 with a base polymer matrix 12 and spheroid filler 14 is provided. In this prior art example, the base matrix 12 is loaded with low aspect ratio filler 12 which typically has a length to width ratio less than 5:1. For example, the mixture may include, by volume, 40 base matrix and 60 percent granular or spheroid filler. The base polymer matrix 12 is, essentially, non-conductive and the spheroid filler 14 is a metallic material or boron nitride which has an independent thermal conductivity of on the order of approximately 400 W/m° K.

As can be understood, the loading of thermally conductive filler in a polymer base matrix will render the material thermally conductive while permitting the material to be moldable. When employed as a thermal conductor, the material 10 must thermally transfer heat from, for example, side X to side Y of the material. During this transfer, heat must travel from heat conductive filler member to the adjacent heat conductive filler member to travel the path from X to Y. Since the selected filler in FIG. 1 are low aspect ratio granular or spheroid members, heat must cross many interfaces between several filler members as well as the non-conductive polymer residing therebetween. The more interfaces that heat must cross and the more polymer the heat must pass through, the more degraded the thermal conductivity will be. Further, too much loading of filler material would prevent the base polymer from wetting out resulting in undesirable small air pockets in the finished molded product.

Turning now to FIG. 2, an ideal prior art composition 20 shows the employment of high aspect ratio filler 16 within a polymer base matrix 12. FIG. 2 illustrates the efforts to solve the aforementioned problems associated with having too many interfaces and too much polymer between the two points of heat travel. FIG. 2 shows an ideal composition 20 where high aspect ratio filler 16 is perfectly aligned within polymer base matrix 12. In this ideal composition 20, high aspect ratio filler 16 aligns perfectly to reduce the number of interfaces the heat must cross and the volume of polymer 12 the heat must travel through. In this ideal composition, only two or three interfaces are encountered when going from point X to Y as opposed to the 7 or 8 encountered by composition 10 shown in FIG. 1.

While composition 20 shown in FIG. 2 is ideal and preferred, it is virtually impossible to achieve in the field. This is primary due to geometry of the part to be molded. As stated earlier, one of the primary reasons for employing a thermally conductive plastic composition is that it is moldable into more complex geometries to achieve better heat dissipation. Therefore, intricate part geometries are typically encountered when molding thermally conductive polymer materials.

With these intricate geometries, turbulence of the flow of the filler loaded matrix is common resulting in collisions of the filler material and non-uniform alignment. While parallel aligned of the high aspect ratio filler is obviously preferred, it cannot be attained. Further, the turbulence of flow and collisions with edges of the mold often breaks the high aspect ratio filler particularly when it has an aspect ratio larger than 20:1. FIG. 3 illustrates a realistic composition 30 with filler 16 being somewhat aligned to adjacent filler 16 within polymer 12. FIG. 3 is what is encountered in the field, due to the inherent problems associated with molding material with filler therein, as opposed to the theoretically ideal arrangement shown in FIG. 2. As can be seen in FIG. 3, the number of interfaces or transitions from one filler 16 to another to travel from point X to Y is reduced as compared to FIG. 1, however, the volume of non-thermally conductive polymer material in the path of travel is increased thus greatly reducing the overall conductivity of the composition through the path X to Y. Further, breakage of the high aspect ratio filler 16 will cause the thermal conductivity of the composition to degrade as well.

Turning now to FIG. 4, a composition 100 of the present invention is shown. Composition 100 includes a base matrix 112 which is preferably a polymer material, such as a liquid crystal polymer. Loaded into the polymer base matrix 112 are low aspect ratio filler 114 and high aspect ratio filler 116 which are both highly thermally conductive materials. The present invention is the employment of both low aspect ratio filler 114 and high aspect ratio filler 116 within the same base matrix 112. As shown in FIG. 3, perfect parallel alignment of high aspect ration filler 116 is not possible. As a result, too many voids between the poorly aligned high aspect ratio filler 116 would exist. The present invention employs low aspect filler 114 to fills the voids naturally left between adjacent high aspect ratio filler due to turbulence during molding and complex mold geometries. As a result of the employment of both low aspect ratio filler and high aspect ratio filler within the same composition, the overall number of transitions surfaces can be greatly reduced while replacing the voids with low aspect ratio filler which were previously filled with non-thermally conductive polymer as shown in FIG. 3.

The present invention 100, as shown in FIG. 4, includes a base matrix 112 which is preferably manufactured of a liquid crystal polymer. Liquid crystal polymer is preferred due to its highly crystalline nature and its natural tendency to align the filled loaded therein. Various other types of polymers can be employed. Further, the base matrix may be of metallic material if die casting of the thermally conductive body is required for the application.

As shown in FIGS. 5–8, various different types of high aspect ratio filler may be employed and still be within the scope of the present invention. As shown in FIGS. 5A and 5B, high aspect ratio filler 116 is shown as a flake-like or plate-like configuration 122 with a length L and thickness T. FIGS. 6A and 6B illustrate another high aspect ratio filler 116 which is shown to be in a rice-like configuration 124 with length L and thickness T. FIGS. 7A and 7B shown a strand-like configuration 126 with a length L and thickness T. FIG. 8 shows a whisker configuration 128 with length L and thickness T. For example, it is preferred that the high aspect ratio filler be carbon flakes that are 2/1000 to 4/1000 of an inch thick while being 40/1000 of an inch long to realize a minimum aspect ratio of approximately 10:1. The aspect ration would preferably be as high as 50:1 or even greater. While such dimensions are preferred, other sizes of high aspect ratio filler may be employed depending on the application at hand. Alternatively, carbon fiber that is 200 microns in diameter may also be employed.

In each of these configurations shown in FIGS. 5–8, which are suitable for employment in the present invention, the aspect ratio of length L to thickness T is at least 10:1. Further, the material employed for the high aspect ratio filler 116 may be aluminum, alumina, copper, magnesium, brass and carbon.

Figure 9:
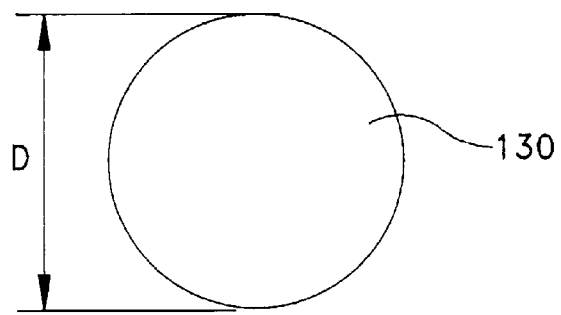
FIG. 9 is a top view of a low aspect ratio spheroid filler member.
Figure 10:
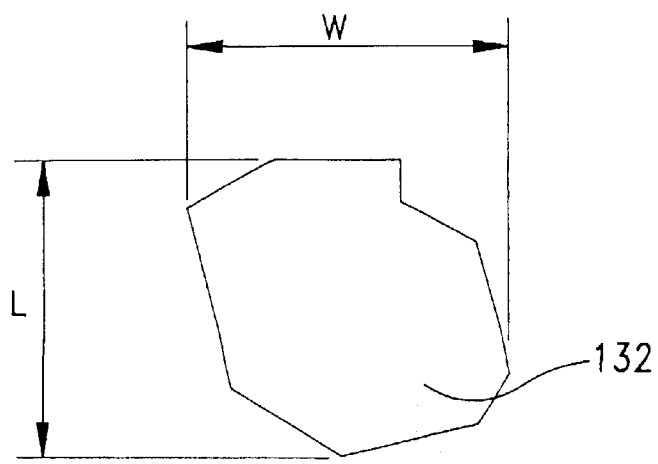
FIG. 10 is a top view of a low aspect ratio grain filler member.

Turning now to FIGS. 9 and 10, two examples of suitable low aspect ratio filler configurations are shown. FIG. 9 shows a substantially spheroid filler configuration 130 where the diameter of the member is D. As a result, the aspect of this filler configuration is approximately 1:1. In addition, FIG. 10 illustrates a grain-like or granular filler configuration 132 to serve as the low aspect ratio filler 114. This granular configuration 132 is somewhat random in shape and may have height H to width W ratio of 2:1, or the like. The low aspect ratio filler 114, in accordance with the present invention, is of a ratio of 5:1 or less. Further, the material employed for the low aspect ratio filler 114 may be aluminum, alumina, copper, magnesium, brass and carbon. The low aspect ratio filler is preferably approximately 10/1000 of an inch in diameter or along its width but may be of different sizes depending on the application at hand.

In the composite mixture of the present invention, it is preferred that, by volume, the base matrix 112 be 30 to 60 percent; that the high aspect ratio filler 116 be 25 to 50 percent; and that the low aspect ratio filler 114 be 10 to 25 percent. With the foregoing disclosed ranges, high volume loading and proper wet-out can be achieved.

Below is an example and preferred embodiment of the present invention.

EXAMPLE

A base matrix of liquid crystal polymer is provided as 50 percent (by volume) of the composition mixture. High aspect ratio carbon flakes, with an aspect ratio of approximately 50:1 and independent thermal conductivity of approximately 800 W/m° K., are provided as approximately 35 percent (by volume) of the composition mixture. Finally, 15 percent (by volume) of boron nitride granules, with an aspect ratio of approximately 4:1 and independent thermal conductivity of approximately 400 W/m° K., are provided.

The comparison below illustrates the thermal conductivity of the prior art compositions shown in FIGS. 1 and 3 as compared to the composition of the present invention shown in FIG. 4.

| | Base Polymer (by volume) | High Aspect Ratio Filler (by volume) | Low Aspect Ratio Filler (by volume) | Thermal Conductivity (W/m° K.) |
|---|---|---|---|---|
| Prior Art (FIG. 1) | 40% LCP | N/A | 60% Boron Nitride Grains | 19 |
| Prior Art (FIG. 3) | 50% LCP | 50% Carbon Fiber Random Lengths Min 50:1 Aspect Ratio | N/A | 22 |
| Present Invention (FIG. 4) | 50% LCP | 35% Carbon Fiber Random Lengths Min 50:1 Aspect Ratio | 15% Boron Nitride Grains | 28 |

In view of the foregoing, a superior moldable highly thermally conductive composite material can be realized. The composition of the present invention, greatly improves over prior art attempts to provide such a moldable heat conductive material. In particular, the present invention, provides thermal conductivity that is vastly improved over known compositions to permit complex part geometries to achieve more efficient heat sink devices.

It would be appreciated by those skilled in the art that various changes and modifications can be made to the illustrated embodiments without departing from the spirit of the present invention. All such modifications and changes are intended to be covered by the appended claims.

What is claimed is:

1. A high thermally conductive molding composition having a thermal conductivity above 22 W/m° K. and being net-shade moldable, comprising:
   a polymer base matrix of, by volume, between 30 and 60 percent;
   a first thermally conductive filler, by volume, between 25 and 60 percent; said first thermally conductive filler having an aspect ratio of at least 10:1; and
   a second thermally conductive filler, by volume, between 10 and 25 percent; said second thermally conductive filler having an aspect ratio of less than 5:1.

2. The molding composition of claim 1, wherein said polymer base matrix is a liquid crystal polymer.

3. The molding composition of claim 1, wherein said first thermally conductive filler is of a flake configuration.

4. The molding composition of claim 1, wherein said first thermally conductive filler is of a rice configuration.

5. The molding composition of claim 1, wherein said first thermally conductive filler is of a strand configuration.

6. The molding composition of claim 1, wherein said first thermally conductive filler is of a whisker configuration.

7. The molding composition of claim 1, wherein said first thermally conductive filler is a metallic material selected from the group consisting of aluminum, alumina, copper, magnesium and brass.

8. The molding composition of claim 1, wherein said first thermally conductive filler is carbon material.

9. The molding composition of claim 1, wherein said second thermally conductive filler is spheroid in shape.

10. The molding composition of claim 1, wherein said second thermally conductive filler is of a grain configuration.

11. The molding composition of claim 1, wherein said second thermally conductive filler is a metallic material selected from the group consisting of aluminum, alumina, copper, magnesium and brass.

12. The molding composition of claim 1, wherein said second thermally conductive filler is boron nitride.

13. The molding composition of claim 1, wherein said second thermally conductive filler is carbon.

14. The molding composition of claim 1, wherein said polymer base is of approximately 50 percent by volume; said first thermally conductive filler is of approximately 35 percent by volume; and said second thermally conductive filler is of approximately 15 percent by volume.

15. A thermally conductive polymer composition, having a thermal conductivity over 22 W/m° K. and being net-shape moldable, comprising a mixture of a polymer and a first thermally conductive filler material and a second thermally conductive filler material; said first thermally conductive filler material having an aspect ratio greater than 10:1; said second thermally conductive filler material having an aspect ratio less than 5:1.

16. The polymer composition of claim 15, wherein said polymer is a liquid crystal polymer.

17. The polymer composition of claim 15, wherein said first thermally conductive filler material is carbon flakes.

18. The polymer composition of claim 15, wherein said second thermally conductive filler material is boron nitride grains.

19. A thermally conductive composition, having a thermal conductivity over 22 W/m° K. and being net-shape moldable, comprising:

a polymer base matrix material;

a first thermally conductive filler material having an aspect ratio configuration of at least 10:1; and a second thermally conductive filler material having an aspect ratio configuration of 5:1 or less.

20. A thermally conductive injection molding composition having a thermal conductivity above 22 W/m° K. and being net-shape moldable, comprising:

a metallic base matrix material;

a first thermally conductive filler material having an aspect ratio configuration of at least 10:1; said first thermally conductive filler being carbon fiber; and a second thermally conductive filler material having an aspect ratio configuration of 5:1 or less; said second thermally conductive filler being made of a material selected from the group consisting of carbon and boron nitride.

21. A high thermally conductive injection molding composition having a thermal conductivity above 22 W/m° K. and being net-shape moldable, comprising:

a polymer base matrix of, by volume, between 30 and 60 percent;

a first thermally conductive filler, by volume, between 25 and 60 percent; said first thermally conductive filler having an aspect ratio of at least 10:1 and a thermal conductivity of approximately 800 W/m° K.; and a second thermally conductive filler, by volume, between 10 and 25 percent; said second thermally conductive filler having an aspect ratio of less than 5:1 and a thermal conductivity of approximately 400 W/m° K.

22. A high thermally conductive injection molding composition having a thermal conductivity above 22 W/m° K. and being net-shape moldable, comprising:

a polymer base matrix of, by volume, between 30 and 60 percent;

a first thermally conductive filler, by volume, between 25 and 60 percent; said first thermally conductive filler having an aspect ratio of at least 10:1 and a thermal conductivity of at least 800 W/m° K.; and a second thermally conductive filler, by volume, between 10 and 25 percent; said second thermally conductive filler having an aspect ratio of less than 5:1 and a thermal conductivity of at least 400 W/m° K.

* * * * *